United States Patent [19]

Nitta et al.

[11] Patent Number: 5,403,773
[45] Date of Patent: Apr. 4, 1995

[54] METHOD FOR PRODUCING A SEMICONDUCTOR LIGHT EMITTING DEVICE

[75] Inventors: Toshiyuki Nitta; Takashi Iwasaki, both of Osaka, Japan

[73] Assignee: Sumimoto Electric Industries, Ltd., Osaka, Japan

[21] Appl. No.: 88,639

[22] Filed: Jul. 9, 1993

[30] Foreign Application Priority Data

Jul. 10, 1992 [JP] Japan ................... 4-207487

[51] Int. Cl.⁶ ........................................... H01L 21/20
[52] U.S. Cl. ....................... 437/126; 437/127; 437/129; 437/133; 385/49
[58] Field of Search ............... 437/129, 126, 133, 127; 385/49

[56] References Cited

U.S. PATENT DOCUMENTS

| | | | |
|---|---|---|---|
| 4,830,453 | 5/1989 | Khoe | 385/49 |
| 4,989,051 | 1/1991 | Whitehead et al. | 385/49 |
| 5,181,263 | 1/1993 | Derfiny | 385/49 |
| 5,194,105 | 3/1993 | Nguyen | 385/49 |

FOREIGN PATENT DOCUMENTS 57-29067 6/1982 Japan .
60-161684 8/1985 Japan .

OTHER PUBLICATIONS

Wolf et al. in "Silicon processing for the VLSI era", vol. 1, Lattice press Sunset beach, Calif.; 1986, pp. 473-476.

*Primary Examiner*—R. Bruce Breneman
*Assistant Examiner*—Ramamohan Rao Paladugu
*Attorney, Agent, or Firm*—Cushman Darby & Cushman

[57] ABSTRACT

A surface emitting type of light emitting devices has a narrow emanating region near the front surface. A spherical lens is fixed on the front surface or rear surface for converging light beams to a core of an optical fiber. Prior devices determined the position of the spherical lens by forming a concavity or a set of protrusions on the rear surface. Two wafer processes were required to form the concavity or protrusions. Two wafer processes on both surfaces induced not a little positioning error.

This invention does not form concavities nor protrusions on the rear surface. The rear surface is ground and left flat. Second electrode is formed on the rear surface, not hindering light to emit through. The center of the emanating region is determined by supplying current to the device and illuminating the emanating region. The emanating pattern is observed by a TV camera connected to a computer. The center of the emanating region is detected by image processing of the illuminated pattern. The position of the center is memorized. Adhesive is supplied to the rear surface of the chip. A spherical lens is carried to a spot of the memorized coordinate. The adhesive is hardened in a moment to fix the lens at the spot.

4 Claims, 2 Drawing Sheets

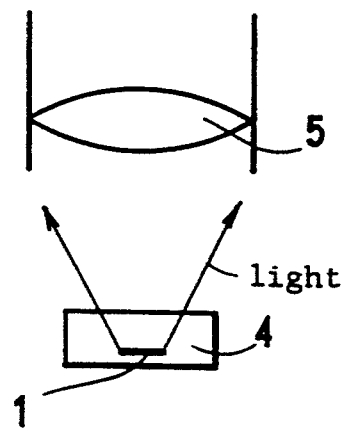
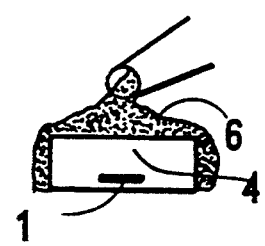
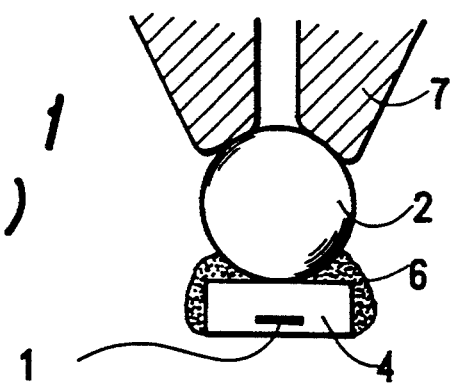
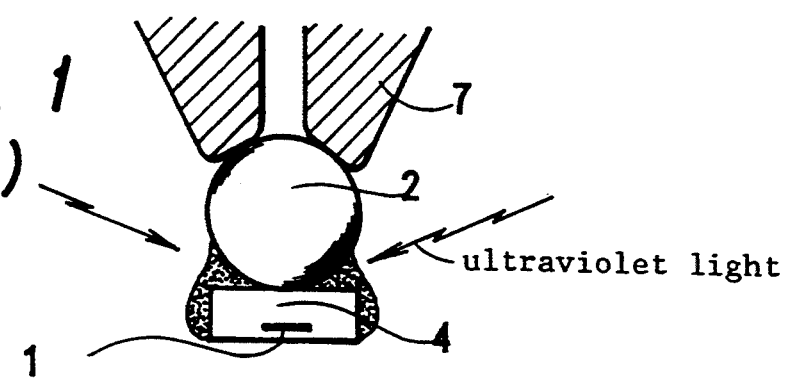
FIG. 1 (a)
FIG. 1 (b)
FIG. 1 (c)
FIG. 1 (d)

METHOD FOR PRODUCING A SEMICONDUCTOR LIGHT EMITTING DEVICE

FIELD OF THE INVENTION

This invention relates to a method for producing light emitting devices pertinent to optoelectronic transmission of information. Semiconductor light emitting devices mean a light emitting diode and a laser diode. The material for semiconductor light emitting devices is GaAs, GaP, InP, etc. The light emitting device is further classified by the direction of emission; one is a surface-emission type which emits light from a surface of a semiconductor chip and the other is an end-emission type which emits light from an end of a chip. This invention proposes an improvement of the surface-emission type of light emitting devices. The surface-emission type devices allow light to spread widely to all directions from a narrow light emanating region. Thus, a lens is required to converge the light from the light emitting device to a core of an optical fiber. The lens must converge the light to the narrow core with high efficiency.

In the cases of optical communication systems or optical measurement systems, a spherical lens is directly fixed on a chip of a light emitting device for coupling the chip to a core of an optical fiber. Owing to the wide divergence of light at the emanating region of the chip and the narrowness of the fiber core, it is preferable to mount a spherical lens directly on the chip of a light emitting device. This is because a spherical lens has a short focus and spherical symmetry. Such a direct mounting prevails in the coupling between an optical fiber and a light emitting device in the optoelectronic communication or optical measurements. Indirect coupling of a lens is not favorable. Here the indirect coupling means that a semiconductor chip is fixed on a workpiece of a package and a cap having a lens covers the workpiece. The indirect coupling Is frequently used for a photodiode.

BACKGROUND OF THE INVENTION

This application claims the priority of Japanese Patent Applications No. 207487/1992 filed Jul. 10, 1992, which is incorporated herein by reference.

Japanese Patent Publication No. 57-29067 (29067/1982) proposed a structure of a light emitting device produced by the steps of boring a circular concavity on a front surface of a chip above an emanating region, supplying adhesive on the concavity and fixing a spherical lens on the concavity by the adhesive. The structure succeeded in the correct positioning of the lens, because the lens circularly contacts with the verge of the concavity. If the center of the emanating region coincides with the center of the concavity, the center of the lens coincides with the center of the emanating region. However, since painting of adhesive on the concavity precedes a spherical lens fitting on the adhesive-painted concavity, the adhesive with high viscosity is not excluded enough from the concavity. Then, the spherical lens is not able to come into contact with the verge of the concavity, floating on the adhesive away from the edge of the concavity. This is a difficulty of Japanese Patent Publication No. 57-29067.

Another drawback is the deviation of the center of the emanating region from the center of the concavity. The center of the emanating region does not always coincide with the center of the concavity in the direction of a normal to the surface. If the center of the emanating region deviates from the center of the concavity, the center of the emanating region will also deviate from the spherical lens. The light converged by the lens will launch in an oblique direction instead of a vertical direction.

Japanese Patent Laying Open No. 60-161684 (161684/1985) proposed another structure of a lens mount on a semiconductor chip. Instead of boring a circular concavity on a device chip, '684 formed several protrusions on a surface of a chip. The center of the plural protrusions was determined to coincide with the center of the emanating region in the chip. The heights and positions of the protrusions were designed for enabling the spherical lens to come into contact with the edges of all protrusions. The position of the ball lens was completely determined by the protrusions. There was no room for the ball lens (spherical lens) to displace at all. The set of protrusions allowed a unique determination of the position to the lens. The lens was fixed among the protrusions by glue.

In general, the light emitting device has a narrow emanating region and a core of an optical fiber is also narrow in the optoelectronic communication systems. Effective coupling between a fiber and a light emitting device requires a small tolerance less than 2 μm of positioning the spherical lens in the direction parallel with the surface.

However, the light emitting devices on which a lens is directly fixed suffer from the difficulty of positioning. Such a lens-carrying type device has an emanating region on one surface and a lens on the other surface. The first surface with the emanating region is now referred to as a front surface and the second surface having the lens is referred to as a rear surface. The active region (emanating region) has been fabricated on the front surface by the wafer process including the steps of epitaxial growths of layers, photolithography and etching. If the rear surface must be provided with protrusions for retaining a ball lens, the protrusions shall also be produced on the rear surface by another wafer process including the steps of photolithography and dry etching. Thus, the lens-carrying type device requires double wafer processes on the front surface and the rear surface.

Single wafer process allows exact positioning of parts, e.g. an electrode, pn-junctions, active regions, etc. However, the double wafer processes on both surfaces cannot obtain high precision of positioning of the parts which are made on both surfaces. Significant errors surely accompany the double wafer processes treating with both surfaces. The drawback will now be explained more In detail.

A compound semiconductor wafer, e.g. GaAs, InP or GaP wafer is used for producing high emitting devices. The wafer has initially a thickness of 400 μm to 600 μm for facilitating the handling of wafer in the succeeding wafer process. The emitting devices are fabricated by the wafer process comprising the steps of epitaxial growth, impurity diffusion, etching, and forming an electrode on the front surface of the wafer whose rear surface is fixed to a workpiece. The first wafer process makes a lot of equivalent devices on the front surface of the wafer. The emanating region (active layer or pn-junction) has been formed near the front surface.

Then, the wafer is taken off from the workpiece. The wafer is again fixed on a head of a grinding apparatus upside down. The front surface having the emanating region is glued to the supporting head. The rear surface of the wafer (substrate side) is ground till the thickness decreases to about 100 μm to 200 μm. The reduction of the thickness is indispensable to heighten the diffusion of heat which will be yielded by the injection current flowing through the emanating region (pn-junction or active layers). Preferably the wafer should be thinned to a thickness of 100 μm to 200 μm. The grinding treatment eliminates the material by a thickness of about 300 μm to 400 μm from the rear surface of the wafer. The grinding decreases the distance between the rear surface and the emanating region (active layers) to less than 100 μm to 200 μm. The grinding treatment contributes to both enhancing the thermal diffusion and alleviating the absorption of light between the emanating region and the rear surface (emitting surface).

After the grinding treatment, the wafer experiences another wafer process on the rear surface. The front surface is glued to a workpiece for the second wafer process. The second wafer process etches the rear surface for boring concavities or forming protrusions. The positions of the concavities or protrusions should be determined in coincidence with the emanating regions. Therefore, the wafer is treated by two wafer processes on both surfaces. The lens-carrying type devices require double wafer processes applied to the front surface and the rear surface. An emanating region is fabricated per a unit of device on the front surface by the first wafer process. A concavity or a set of protrusions is formed per a unit of device on the rear surface (emitting surface) by the second wafer process. A single wafer process applied on a single surface can achieve high-precision positioning of parts, e.g. diffusion regions, pn-junctions, or an electrode. However, the double wafer processes cannot secure the precise positioning of the parts on different surfaces.

The double wafer processes make a lot of units of light emitting devices on a wafer. The wafer is scribed along cleavage lines and divided into individual device chips. One chip corresponds to one light emitting device. The chip will be mounted on a package with a lens and leads. Electrodes of the device chip will be connected to the leads of the package.

A wafer is 2 inches to 3 inches in diameter. But a chip is a small rectangle with sides of 300 μm to 500 μm. As mentioned so far, in order to fabricate the lens-carrying devices, the emanating regions, or an electrode must be produced on the front surface by the first wafer process, the rear surface must be ground and the concavities or protrusions must be formed on the rear surface by the second wafer process, e.g. etching, evaporation, photolithography, etc.

The tolerance of deviation between the center of the emanating region on the front surface and the center of the concavity or protrusions on the rear surface must be less than 2 μm. However, the wafer has so large diameter and so thin thickness that wafer is likely to warp. The warp of wafer hinders tight contact between the wafer and a mask in photolithography. Air gap between the wafer and mask induces positioning errors of the spots to be exposed by light. Thus, the warp of wafer makes the positioning of parts on both surfaces difficult. The deformation of wafer increases the errors relating to the positioning of parts on two surfaces. Because of the warp of wafer and the double wafer processes, the center of the emanating region on the front surface is apt to deviate from the center of the concavity or protrusions on the rear surface. Thus, the positioning error between the front emanating region and the rear concavity or protrusions often exceeds the tolerance of 2 μm.

The surface-emission type device was provided with a spherical lens by the steps of adjusting the positions on both surfaces, boring a concavity or protrusions and gluing a spherical lens in the concavity or protrusion. Owing to the difficulty of coincidence of positions on two surfaces, the center of a lens does not necessarily coincide with the center of the emanating region within the tolerance. The discrepancy between the lens and the emanating region decreases the coupling efficiency to an optical fiber. Here, the coupling efficiency means the ratio of light beams attaining a fiber core to the total light beams emitted from the emanating region. Therefore, the light emitting devices have to be tested with regard to the coupling efficiency, after the devices have been completely assembled in packages or receptacles with an optical fiber. The coupling efficiency is examined by applying current to the light emitting device and measuring the light intensity at the further end of the optical fiber. Since the lens has been fixed by adhesive, the position of the lens cannot be corrected. Therefore, the samples which reveal a low coupling efficiency less than a predetermined value must be abandoned. Only the samples with a coupling efficiency over the valve pass the test. Thus, prior method of assembling a lens on a device has been annoyed with low yield of products. Low yield has substantially raised the cost of fabrication.

A purpose of this invention is to provide a method of producing lens-bearing light-emitting devices without double wafer processes on both surfaces which tends to invite positioning errors between two surfaces.

Another purpose of this invention is to provide a method of producing lens-bearing devices which can harmonize the center of the emanating region with the center of the lens.

Another purpose of this invention is to provide a method of producing lens-bearing devices which enables to adjust the positions of parts with high precision.

The other purpose of the invention is to provide a method of producing lens-bearing devices with high yield.

SUMMARY OF THE INVENTION

The method for producing a semiconductor light-emitting device of this invention comprises the steps of making emanating regions and an electrode on a front surface of wafer, grinding the rear surface of the wafer to a definite thickness with high precision, forming an electrode on the rear surface, dividing the wafer into individual device chips, mounting a device chip at the front surface on a workpiece, supplying current to the electrodes of the chip for letting the emanating region emit light beams, observing the light beams from the rear surface by a television camera, determining the position of a center of the emanating region by image processing, storing the position of the center of the emanating region in a memory, supplying adhesive on the rear surface of the chip, holding a spherical lens with a vacuum collet, carrying the lens to the position of the center of the emanating region in contact with the rear surface, hardening the adhesive in order to fix the lens at the position of the center of the emanating region, and releasing the spherical lens from the vacuum collet.

The adhesive is preferably a ultraviolet hardening resin, since the resin is hardened in a moment by irradiating with ultraviolet light. In the case of the ultraviolet hardening adhesive, ultraviolet beams should be applied to the adhesive when the vacuum collet brings the ball lens just above the center of the emanating region. Since the position of the center has already been memorized, it is easy to bring the spherical lens to the position of the center, although the adhesive may blur the surface of the chip.

The significance of the steps will be explained in detail. In this invention, the grinding of the rear surface is important. Grinding of the rear surface is now referred to as back-grinding in short. In this invention, the rear surface is ground uniformly to a predetermined thickness with high precision. Every distance from the emanating region to the ground rear surface is the same in the wafer, i.e. for all individual devices. Equalizing every distance for all devices allows a spherical lens to keep a constant distance from the emanating region, when the lens is laid on the rear surface, being in contact with the surface. In the contacting state, the distance $d_2$ between the center of the lens and the center of the emanating region is a sum of a radius r of the spherical lens and the distance de between the rear surface and the center of the emanating region. Namely, this invention requires the constant $d_2$ overall in a wafer and the equation $d_1 = d_2 + r$. $d_1$ and r are predetermined constants. $d_1$ has been determined to be an optimum value of the distance between the center of the lens and the emanating region. r is the radius of the spherical lens. The back grinding must eliminate the substrate of the wafer exactly so as to reduce the distance $d_2$ from the emanating region to the rear surface to the difference $(d_1 - r)$. One of the features of this invention is expressed simply by $d_2 = d_1 - r$. High precision back grinding allows to equalize the distances $d_2$ from the emanating regions to the rear surface within a small tolerance.

Three dimensional coordinate O-XYZ is now defined for the convenience of explanation. Origin is set to the center of the emanating region. XY-plane is parallel with the surfaces of the wafer. X-axis is parallel with a cleavage line. Y-axis is parallel with another cleavage line. Z-axis is vertical to the surfaces. The position of the lens is simply denoted by the coordinate (x, y, z). The distance L between the spherical lens and the emanating region is given by $L = (x^2 + y^2 + z^2)^{\frac{1}{2}}$. The optimum position of the center of the lens is $x = 0$, $y = 0$, $z = d_1$. High precision back grinding improves the positioning along Z-axis. Namely, Z is precisely determined by the exact back grinding of the wafer. The tolerance of the thickness is about $\pm 40$ μm in this invention. Preferably the tolerance is about $\pm 10$ μm in the back grinding.

If the back grinding is inaccurate and $d_2 < d_1 - r$, the lens must float in the adhesive, separating from the rear surface with a gap of $(d_1 - r - d_2)$ in order to obtain high coupling efficiency. If the back grinding is inaccurate and $d_2 > d_1 - r$, the optimum position of lens does not exist. Thus, the high precision grinding of the rear surface is one of most important characteristics of this invention. Recent development of grinding technology enables the inventors to assemble the lens-bearing device with high coupling efficiency. The back grinding relates only to Z-direction positioning of lens. After the back grinding, a flat electrode is formed on the rear surface. The electrode allows light to emit therethrough.

Another feature of the invention is the X-direction and Y-direction positioning of lens by the steps of observing a emanating region radiating through the substrate by a TV camera with a microscope, image-processing of the emanating region for determining the two-dimensional coordinate of the center thereof, memorizing the coordinate of the center of the emanating region, and carrying a ball lens by a vacuum collet to the memorized position just above the center of the emanating region.

None of prior methods supplied a current to devices for letting the emanating region emit light beams. Thus, prior methods failed in finding the position of the emanating region. There was no necessity for prior methods using concavities or protrusions to find the centers of emanating regions, because the concavities or protrusions firmly determined the position of a ball lens in XY-plane. Determination in XY-plane was insignificant in prior methods.

However, this invention forms no concavities nor protrusions on the rear surface, leaving the rear surface flat with an electrode not hindering light to emanate therethrough. Thus, the second wafer process on the rear surface is now totally unnecessary. This invention dispenses with the second wafer process by which prior methods formed concavities or protrusions for positioning in XY-plane. This invention is immune from the positioning error between the front surface and the rear surface, because this invention is carried out without any holes, projections or marks on the rear surface.

Since the rear surface is entirely flat without structures, the positioning of lens in XY-plane becomes inevitable. Therefore, the position of the emanating region in XY-plane is investigated by letting the emanating region glow, observing the glowing emanating region, determining the position of the center thereof and memorizing the two dimensional coordinate of the center. Then a ball lens is carried to a spot of the coordinate (0, 0, $d_1$) by the collet and is fixed on the rear surface by hardening the adhesive.

Flat rear surface of a wafer except the electrode is not a drawback but an advantage of this invention. Although the flatness of the rear surface demands the two-dimensional positioning of a spherical lens, the flatness allows a vacuum collet to carry the lens to an arbitrary point which surely heightens the accuracy for positioning a lens.

Advantages of the invention will be explained now.

The method of this invention grinds the rear surface (substrate side) of a wafer with high precision till the distance $d_2$ between the emanating regions and the rear surface decreases to a definite value $(d_1 - r)$, where r is a radius of a spherical lens and $d_1$ is the optimum distance between the center of the lens and the center of the emanating region. This is a positioning in Z-direction.

Then this method finds two-dimensional position of the emanating region fixed on a workpiece by observing the emanating region illuminating through a TV camera and image-processing by a computer. The two-dimensional coordinate of the center of the emanating region on the workpiece is memorized in a memory. Adhesive is supplied to the rear surface of the chip. Then a carrying apparatus carries a spherical lens by holding it with a vacuum collet to the position expressed by the coordinate (0, 0, $d_1$) in the three dimensional coordinate defined by designating the center of emanating region as origin. Since the rear surface is flat except the electrode, the carrying apparatus can convey a spherical lens to an arbitrary spot. The flat surface of the rear surface and the image processing for finding the center of the emanating region realize the best positioning of a lens with maximum coupling efficiency.

Furthermore, the adhesive encloses and protects the pn-junction of a chip. The adhesive plays a role of a passivation film for protecting the pn-junction of the device from intrusion of oxygen, water and heavy metal, and diffusion of ions, etc.

Unlike the prior methods, this invention does not require two wafer processes on both surfaces. The problems of the position errors between the front parts (e.g. emanating regions) and the rear parts (e.g. concavities) are solved by this invention.

Omission of the steps of forming concavities or protrusions alleviates the time and cost for fabrication.

Conventional methods were annoyed at low yield, since completely assembled devices were examined by applying a current. On the contrary, this invention can find the center of the emanating region by the examination in which a current is applied to the device. Since the lens is mounted on the spot just above the detected emanating region, the coupling efficiency with an optical fiber is high enough. This invention is immune from imperfect products. This invention enjoys high yield of products.

When a spherical lens is mounted on the rear surface of a chip, various examinations, e.g. of electronic properties or of optical properties can be done at once, because electrodes of the chip have been connected to an external power source by some leads and connectors. Such preliminary examinations can reduce the steps of investigating products. This invention proposes a method for fabricating light-emitting devices with high yield and with high productivity. The light emitting devices are most suitable for the light sources of optoelectronic communication.

BRIEF DESCRIPTION OF THE DRAWINGS

FIG. 1 is schematic views of the steps of this invention. FIG. 1(a) shows the step in which a TV camera observes an emanating region of a light emitting device chip. FIG. 1(b) shows the step in which adhesive Is supplied to the device chip. FIG. 1(c) shows the step in which a vacuum collet puts a spherical lens on the rear surface of the device chip. FIG. 1(d) shows the step in which ultraviolet light beams harden the adhesive.

DETAILED DESCRIPTION OF THE PREFERRED EMBODIMENT

Figure 2:
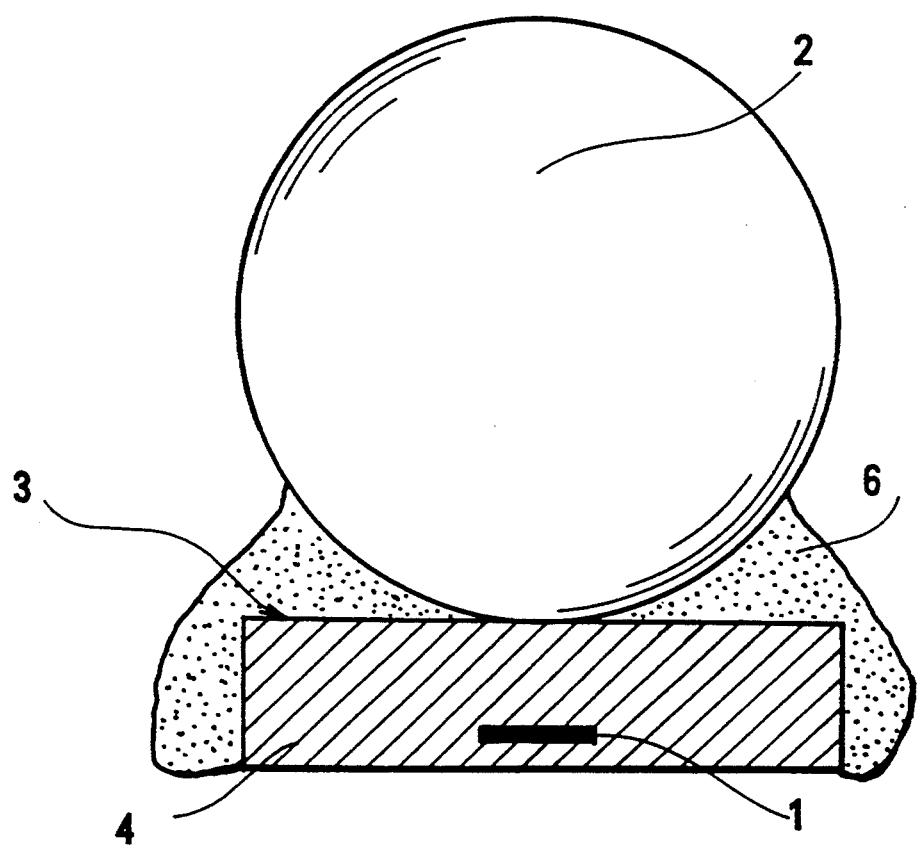
FIG. 2 is a sectional view of a chip on which a spherical lens is glued.

Emanating regions and an electrode are made on a front surface of a wafer fixed to a workpiece by the wafer process comprising, e.g. epitaxial growth of films, diffusion of impurity, etching and photolithography using masks and photoresists. A unit of device includes an emanating region and an electrode in the stage. The wafer is taken off from the workpiece. The wafer is fixed to a head of a grinding apparatus upside down. The rear surface of the wafer is ground with high precision to a predetermined thickness. The thickness of the wafer must be uniform overall. Every distance from the emanating regions to the rear surface Is a constant in the wafer. The rear surface is left flat. No structures are made on the rear surface. The rear surface is free from concavities or protrusions. Another electrode is formed on the rear surface in the form which allows light to emanate therethrough.

Then, the wafer is divided into a lot of individual chips (4) by scribing the wafer along cleavage lines. An individual chip is fixed to a workpiece (not shown in figures). Electrodes of the chip are connected to an outer power source by wires through leads. A current Is applied to the electrodes for lighting the device. A TV camera observes the emission of light beams from the emanating region. An image of the emanating region is formed on a set of image sensors. The camera detects the pattern of the emanating region. Image processing finds out the center of the emanating pattern. Various image processings are available. One treatment determines a center of gravity of the emanating pattern by comparing the light intensity of a pixel with a threshold, dividing the pixels into black pixels and white pixels, deducing an outline of the black pixels or the white pixels, and reckoning the center of gravity of the pattern enclosed by the outline. Another method determines a center of gravity by measuring the brightness of pixels, connecting the pixels with the same brightness, drawing isobright curves on the emanating pattern and detecting the maximum point of the brightness. Therefore, the center of the emanating region is determined with regard to two dimensional coordinate defined on the image plane of the TV camera. The coordinate of the center is memorized in a memory of a personal computer connected to the TV camera.

Then, ultraviolet hardening adhesive (6) is painted on the rear surface of the device chip (4) as shown in FIG. 1(b). The refractive index of the adhesive resin (6) should be similar to the refractive indices of the device chip (4) and the spherical lens (2). If the refractive indices were too different, the loss of light due to the reflection on the boundaries would be too large.

In addition to the fixing of the spherical lens, the adhesive plays a role of a passivation film for protecting the pn-junction of the light-emitting device chip from external pollution or oxidization. Since the ball lens is mounted on the rear surface, the front surface of the chip may be left uncovered. But the ends of the pn-junction are covered with the adhesive. Since the adhesive (6) can also enclose the pn-junction of the chip, the pn-junction (emanating region) could safely be protected from water, oxygen, heavy metal or ions. Thus, the kind of the adhesive should be chosen from the standpoints of the refractive index and the protection function. Then, a vacuum collet (7) driven by a carrying apparatus holds a spherical lens (6), conveys the lens (6) to the spot just above the center of the emanating region. The lens (6) excludes part of the adhesive (6) from the central part as shown in FIG. 1(c).

Furthermore, the ultraviolet hardening adhesive (6) is irradiated by ultraviolet beams. If the spherical lens (2) is transparent to the ultraviolet light, it is convenient to shoot ultraviolet beams downward through the spherical lens (2) to the adhesive region (6). If the spherical lens (2) is opaque to the ultraviolet light like glass B7 or sapphire, the ultraviolet light beams shall be launched from the side of the chip. Irradiation of the ultraviolet beams hardens the adhesive resin. The vacuum collet (7) releases the lens ball. FIG. 2 shows the structure of a lens-bearing device chip according to this invention.

What we claim is:

1. A method for producing a light emitting device having a chip with a front surface, a rear surface, an electrode formed on the front surface and a narrow emanating region near the front surface, and a spherical lens fixed to the rear surface for converging light beams comprising the steps of:

grinding the rear surface of a wafer until the thickness of the wafer is reduced to a value $d_2$, wherein said $d_2$ is determined from the equation $d_2=d_1-r$, wherein $d_1$ is the distance between the center of the spherical lens and the center of the emanating region and r is the radius of the spherical lens, forming another electrode on the rear surface of the wafer in the form which allows light to emanate therethrough, dividing the wafer with a flat rear surface into a plurality of individual device chips having an emanating region and electrodes, mounting a chip on a workpiece at the rear surface of the chip, supplying a current to the device chip for emitting light through the rear surface of the chip, observing the pattern of the emanating region by a TV camera connected to a computer, determining the center of the emanating region in a two-dimensional coordinate defined on the rear surface of the chip, memorizing the coordinate of the center of the emanating region, supplying adhesive on the rear surface of the chip, carrying a spherical lens to a spot of the memorized coordinate above the center of the emanating region, and hardening the adhesive to fix the lens on the rear surface of the chip without a gap between the lens and the rear surface of the chip.

2. A method for producing a light emitting device having a chip with a front surface, a rear surface, an electrode formed on the front surface and a narrow emanating region near the front surface, and a spherical lens fixed to the rear surface for converging light beams comprising the steps of:

grinding the rear surface of a wafer until the thickness of the wafer is reduced to a value $d_2$ with a tolerance of about $+40$ μm, wherein said $d_2$ is determined from the equation $d_2=d_1-r$, wherein $d_1$ is the distance between the center of the spherical lens and the center of the emanating region and r is the radius of the spherical lens, forming another electrode on the rear surface of the wafer in the form which allows light to emanate therethrough, dividing the wafer with a flat rear surface into a plurality of individual device chips having an emanating region and a pair of electrodes, mounting a chip on a workpiece at the rear surface of the chip, supplying a current to the device chip for emitting light through the rear surface of the chip, observing the pattern of the emanating region by a TV camera connected to a computer, determining the center of the emanating region in a two-dimensional coordinate defined on the rear surface of the chip, memorizing the coordinate of the center of the emanating region, supplying adhesive on the rear surface of the chip, carrying a spherical lens to a spot of the memorized coordinate above the center of the emanating region, and hardening the adhesive to fix the lens on the rear surface of the chip without a gap between the lens and the rear surface of the chip.

3. A method as claimed in claim 2, wherein the tolerance of the thickness of the ground wafer is about $\pm 10$ μm.

4. A method as claimed in claim 1, wherein the adhesive is an ultraviolet hardening resin without heavy metal, has a passivation function protecting the device from water or oxygen, and is hardened by irradiation of ultraviolet light beams, and the hardened adhesive has a function of protecting the device as well as the function of fixing the spherical ball.

* * * * *